US006437658B1

(12) United States Patent
Apel et al.

(10) Patent No.: US 6,437,658 B1
(45) Date of Patent: Aug. 20, 2002

(54) THREE-LEVEL SEMICONDUCTOR BALUN AND METHOD FOR CREATING THE SAME

(75) Inventors: Thomas R. Apel; Richard L. Campbell, both of Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 09/863,779

(22) Filed: May 22, 2001

(51) Int. Cl.$^{7}$ .................................................. H03H 7/42

(52) U.S. Cl. ........................................... 333/26; 333/33

(58) Field of Search .......................... 333/26, 33, 24 R, 333/25, 32; 343/859

(56) References Cited

U.S. PATENT DOCUMENTS 5,146,191 A * 9/1992 Mandai et al. .............. 333/161
5,877,667 A * 3/1999 Wollesen .................... 336/200
5,892,668 A * 4/1999 Okamoto et al. ............. 363/40
6,097,273 A * 8/2000 Frye et al. .................. 336/200
6,198,374 B1 * 3/2001 Abel .......................... 336/200
6,317,965 B1 * 11/2001 Okamoto et al. .......... 29/602.1

* cited by examiner

*Primary Examiner*—Robert Pascal
*Assistant Examiner*—Dean Takaoka
(74) *Attorney, Agent, or Firm*—Skjerven Morrill LLP

(57) ABSTRACT

A three-level semiconductor balun is disclosed. In one embodiment, the balun includes a first spiral-shaped transmission line overlying a substrate. The first transmission line has first and second ends. A second spiral-shaped transmission line is substantially vertically aligned with the first transmission line. The second transmission line has a first end electrically connected to the second end of the first transmission line. A third spiral-shaped transmission line is substantially vertically aligned with the first and second transmission lines. The third transmission line has a first end electrically connected to a second end of the second transmission line. The balun may be integrated on the same chip with other RF circuit components, and is suitable for use at higher frequencies than most conventional baluns.

16 Claims, 7 Drawing Sheets

THREE-LEVEL SEMICONDUCTOR BALUN AND METHOD FOR CREATING THE SAME

TECHNICAL FIELD OF THE INVENTION

The present invention relates to integrated circuits, and in particular to a three-level semiconductor balun and method for creating the same.

BACKGROUND OF THE INVENTION

The use of twisted pairs of copper wires to form coupled transmission line elements is well known. These transmission line elements may be used to create baluns, balanced and unbalanced transformers and current and voltage inverters. Examples of the use of conventional transmission line elements are presented in C. L. Ruthroff, "Some Broad-Band Transformers," *Proceedings of the IRE (Institute for Radio Engineers)*, vol. 47, pp. 1337–1342 (August 1959), which is incorporated herein by reference. These transmission line elements are typically found in forms that are useful in frequency bands through UHF.

The use of such transmission line elements in integrated circuits such as RF power amplifiers and low noise amplifiers is desirable. However, the incorporation of off-chip devices such as these conventional transmission line elements into RF devices such as cellular telephones is not competitive due to size and cost. Moreover, conventional coupled transmission line elements are not suitable for use in the desired frequency range.

SUMMARY OF THE INVENTION

Therefore, a need has arisen for a coupled transmission line element that addresses the disadvantages and deficiencies of the prior art. In particular, a need has arisen for a low-loss balun suitable for integration in RF integrated circuits.

Accordingly, a three-level semiconductor balun is disclosed. In one embodiment, the balun includes a first spiral-shaped transmission line overlying a substrate. The first transmission line has first and second ends. A second spiral-shaped transmission line is substantially vertically aligned with the first transmission line. The second transmission line has a first end electrically connected to the second end of the first transmission line. A third spiral-shaped transmission line is substantially vertically aligned with the first and second transmission lines. The third transmission line has a first end electrically connected to a second end of the second transmission line. In one embodiment, a first balanced-side terminal is electrically connected to the first end of the first transmission line, a second balanced-side is terminal electrically connected to the first end of the third transmission line, and an unbalanced-side terminal is electrically connected to the second end of the third transmission line.

In another aspect of the present invention, a method for creating a balun on a semiconductor substrate is disclosed. The method includes forming a first transmission line on the substrate, forming a second transmission line substantially overlying the first transmission line, the second transmission line having a first end electrically connected to the second end of the first transmission line, and forming a third transmission line substantially overlying the first and second transmission lines, the third transmission line having a first end electrically connected to a second end of the second transmission line.

An advantage of the present invention is that the balun may be integrated on the same chip with other RF circuit components. Another advantage of the present invention is that the balun is suitable for use at higher frequencies than most conventional (non-integrated) baluns.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 4 of the drawings. Like numerals are used for like and corresponding parts of the various drawings.

Figure 1:
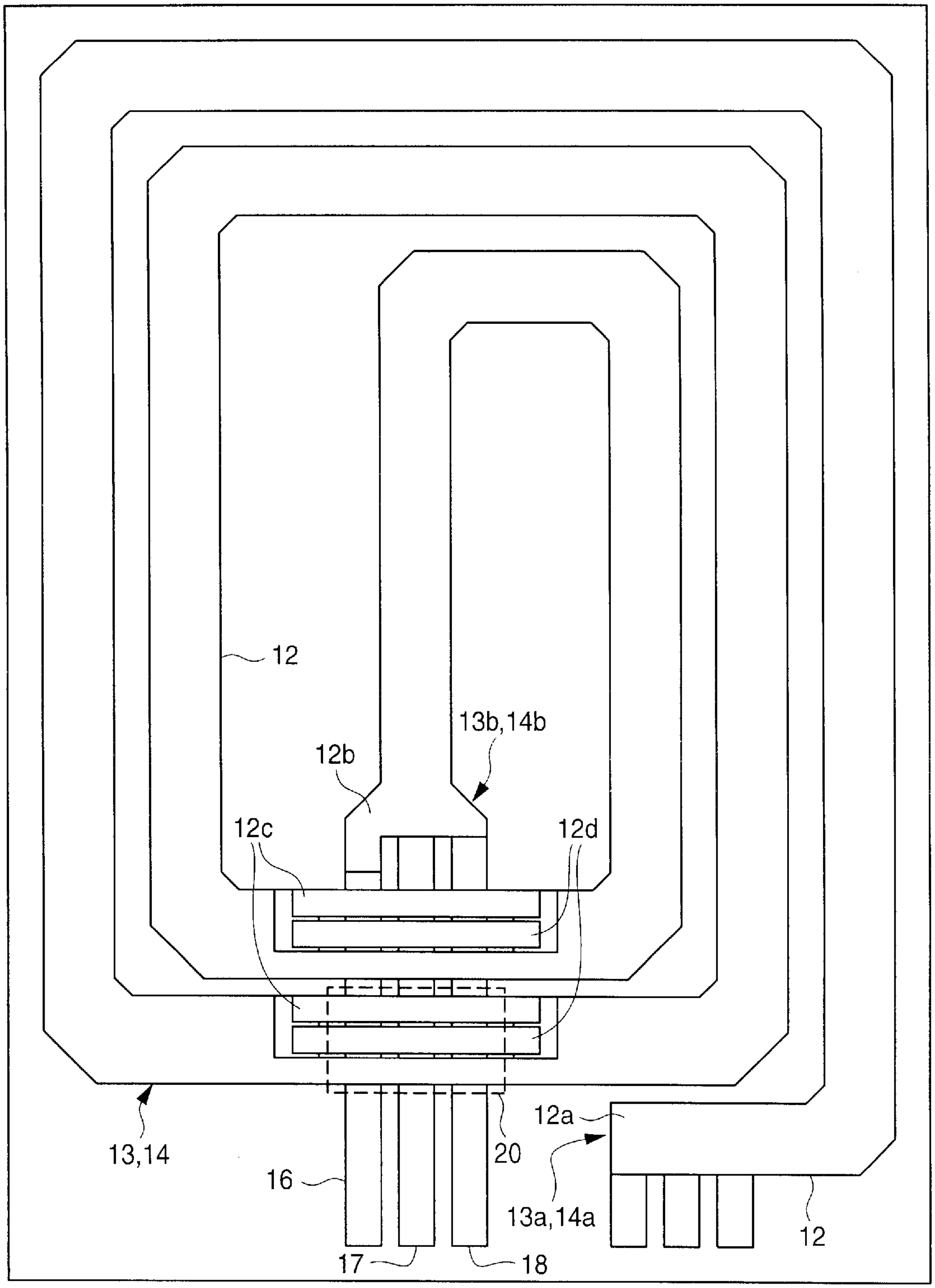
FIG. 1 is a top view of a balun constructed in accordance with the present invention.

Referring to FIG. 1, a top view of a balun 10 constructed in accordance with the present invention is shown. In balun 10, a first transmission line 12 primarily occupies a top metallization layer. Second and third transmission lines 13 and 14, respectively, primarily occupy middle and bottom metallization layers, respectively, underneath the top metallization layer. The top and middle metallization layers are separated by a dielectric layer (not shown in FIG. 1), as are the middle and bottom metallization layers. Each transmission line 12, 13, 14 has an outer terminus 12*a,* 13*a,* 14*a*. From the outer terminus 12*a,* 13*a,* 14*a,* each transmission line 12, 13, 14 spirals inward to an inner terminus 12*b,* 13*b,* 14*b*.

The transmission lines of balun 10 are referred to as "broadside-coupled" because the transmission lines are substantially vertically aligned, giving rise to transmission line coupling between the conductors. Naturally, other effects such as edge coupling between conductor loops within the same metallization layer are also observed. However, the spiral shape of transmission lines 12, 13 and 14 allows the transmission line coupling to predominate over other undesired effects.

The dimensions of balun 10 are preferably such that each transmission line 12, 13, 14 has an overall length that is less than or approximately equal to one-eighth of the signal wavelength. The lower limit of transmission line length will vary depending on device characteristics, but is generally determined by transmission line coupling. In general, it is preferable for the desired "odd mode" or "push-pull" coupling between the transmission lines to predominate over the undesired "even mode" or "common mode" coupling between the transmission lines, as is known to those skilled in the art.

In one exemplary embodiment, signals in the frequency range of 1 GHz to 5 GHz are to be conducted by balun 10. In this embodiment, each transmission line 12, 13, 14 has a width of 15 microns and an overall length of four millimeters. Transmission line 12 has a thickness of approximately 5.5 microns, while transmission lines 13 and 14 each have a thickness of approximately two microns. Transmission lines 12, 13, 14 are separated by dielectric layers (transparent in the illustration of FIG. 1) with a thickness of 1.5 microns.

At the inner terminus 12*b*, 13*b*, 14*b*, each transmission line 12, 13, 14 is electrically connected to a respective connector 16, 17, 18. In one embodiment, connectors 16, 17 and 18 reside in the middle and bottom metallization layers. Connectors 16, 17 and 18 are used to establish electrical contact between the respective inner termini 12*b*, 13*b*, 14*b* and other electrical terminals, as will be described below.

Each loop of the balun 10 requires transmission lines 12, 13 and 14 to cross over connectors 16, 17 and 18. To accomplish this without the use of an additional metallization layer, bridge segments 12*c* and 12*d* of transmission line 12 share space in the top metallization layer with transmission line 12 in each crossover area 20.

Figure 2:
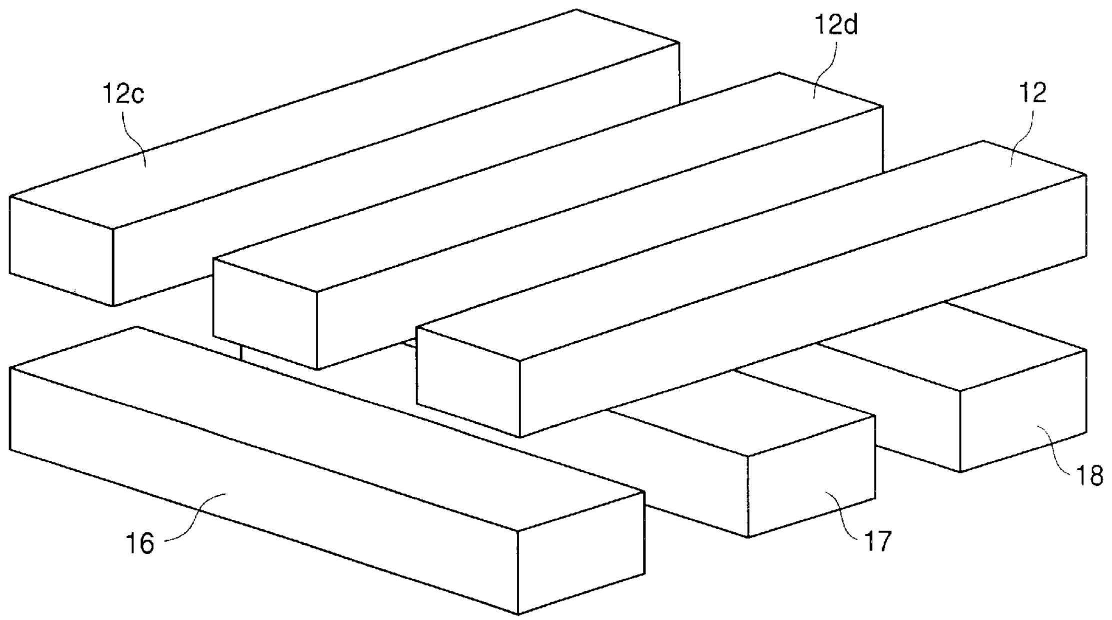
FIG. 2 is a perspective view of a crossover area of the balun.

Referring to FIG. 2, a perspective view of a crossover area 20 is shown. Transmission line 12 and bridge segments 12*c* and 12*d* occupy the top metallization layer while connectors 16, 17 and 18 occupy the middle and bottom metallization layers. Dielectric layers (not shown) separate the metallization layers.

Figure 3A:
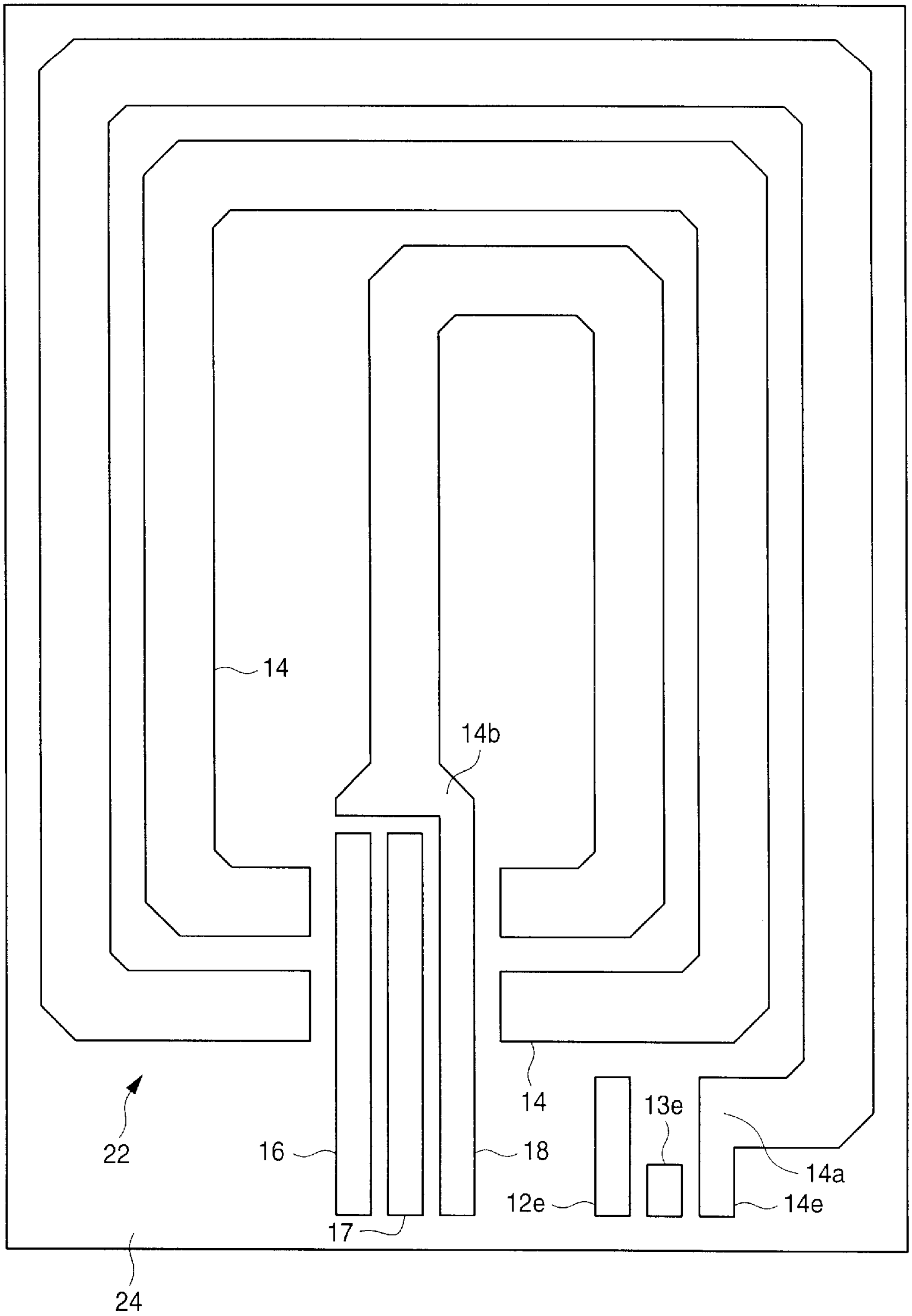
FIGS. 3A through 3E are top views of the balun at various stages of fabrication.

A process for creating balun 10 is illustrated in FIGS. 3A through 3E, where top views of balun 10 at various stages of fabrication are shown. Referring to FIG. 3A, the pattern of the bottom metallization layer 22 is shown. Metallization layer 22 may be, for example, a layer of copper or another conductive material. Metallization layer 22 is deposited on a substrate 24 and etched to create transmission line 14 using conventional deposition and photolithography techniques. Substrate 24 may be, for example, a semi-insulating substrate such as gallium arsenide. The bottom layer of connectors 16, 17, 18 are formed with metallization layer 22. As shown in the figure, the bottom layer of connector 18 is contiguous with transmission line 14 at inner terminus 14*b*.

Also included in metallization layer 22 are two contact strips 12*e*, 13*e*. Strips 12*e* and 13*e* provide electrical contacts in bottom metallization layer 22 to transmission lines 12 and 13, respectively. The manner in which strips 12*e* and 13*e* are connected to their respective transmission lines is described below. A similar extension strip 14*e* of transmission line 14 is provided in proximity to contact strips 12*e* and 13*e*. Thus, all three transmission lines 12, 13, 14 may be contacted from bottom metallization layer 22. All of these strips 12*e*, 13*e*, 14*e* may be connected to other wiring (not shown) patterned in bottom metallization layer 22.

Figure 3B:
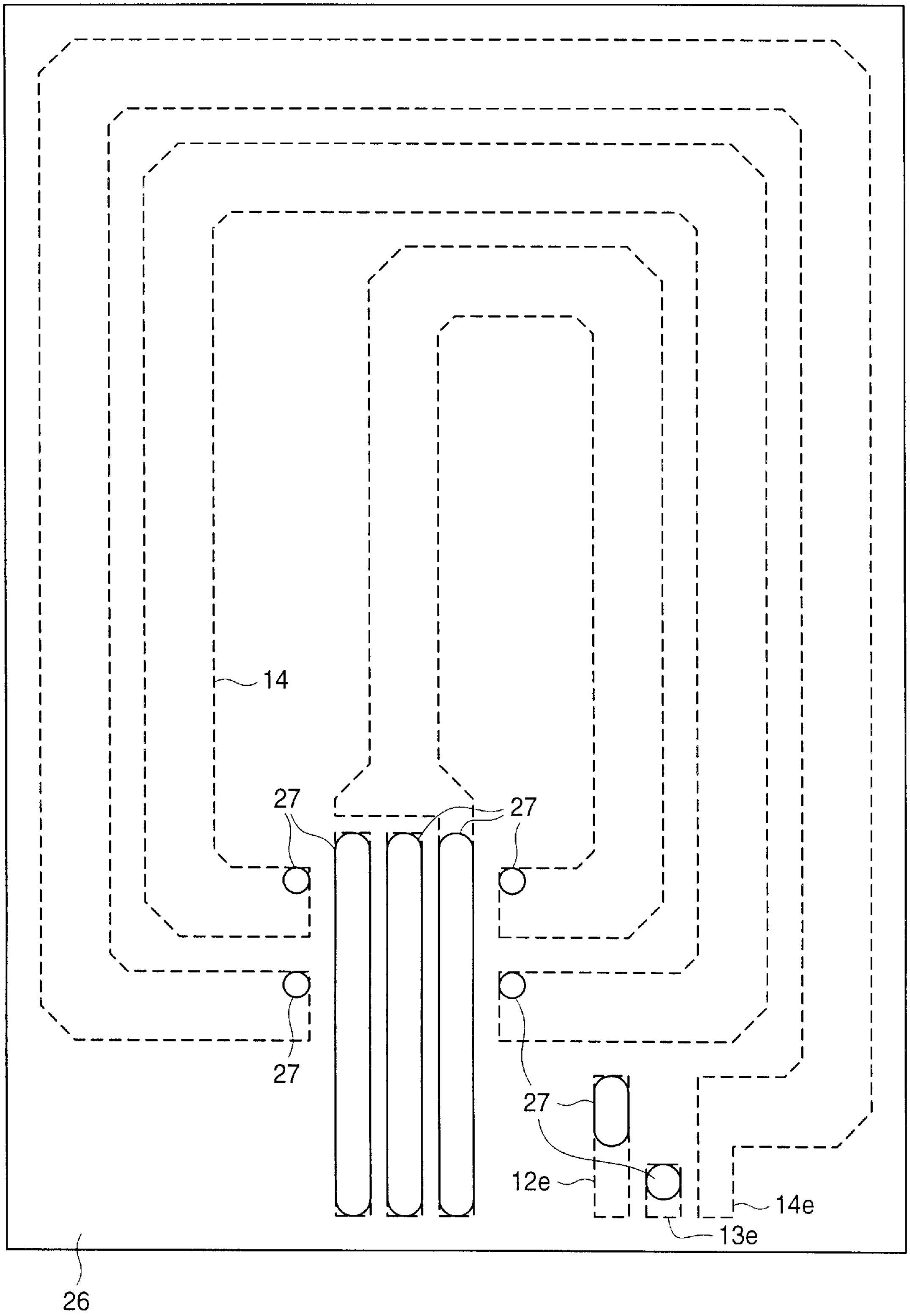

Referring to FIG. 3B, a dielectric layer 26 is deposited over metallization layer 22, which is shown in dashed lines in this figure. Dielectric layer 26 may be, for example, bisbenzocyclobutene (BCB), a nitride or oxide of silicon, or some other insulating material. Dielectric layer 26 is deposited using conventional techniques. Dielectric layer 26 is selectively etched to form openings or vias 27 (shown in solid lines), which allow electrical contact to be establish with the middle metallization layer as described below.

Figure 3C:
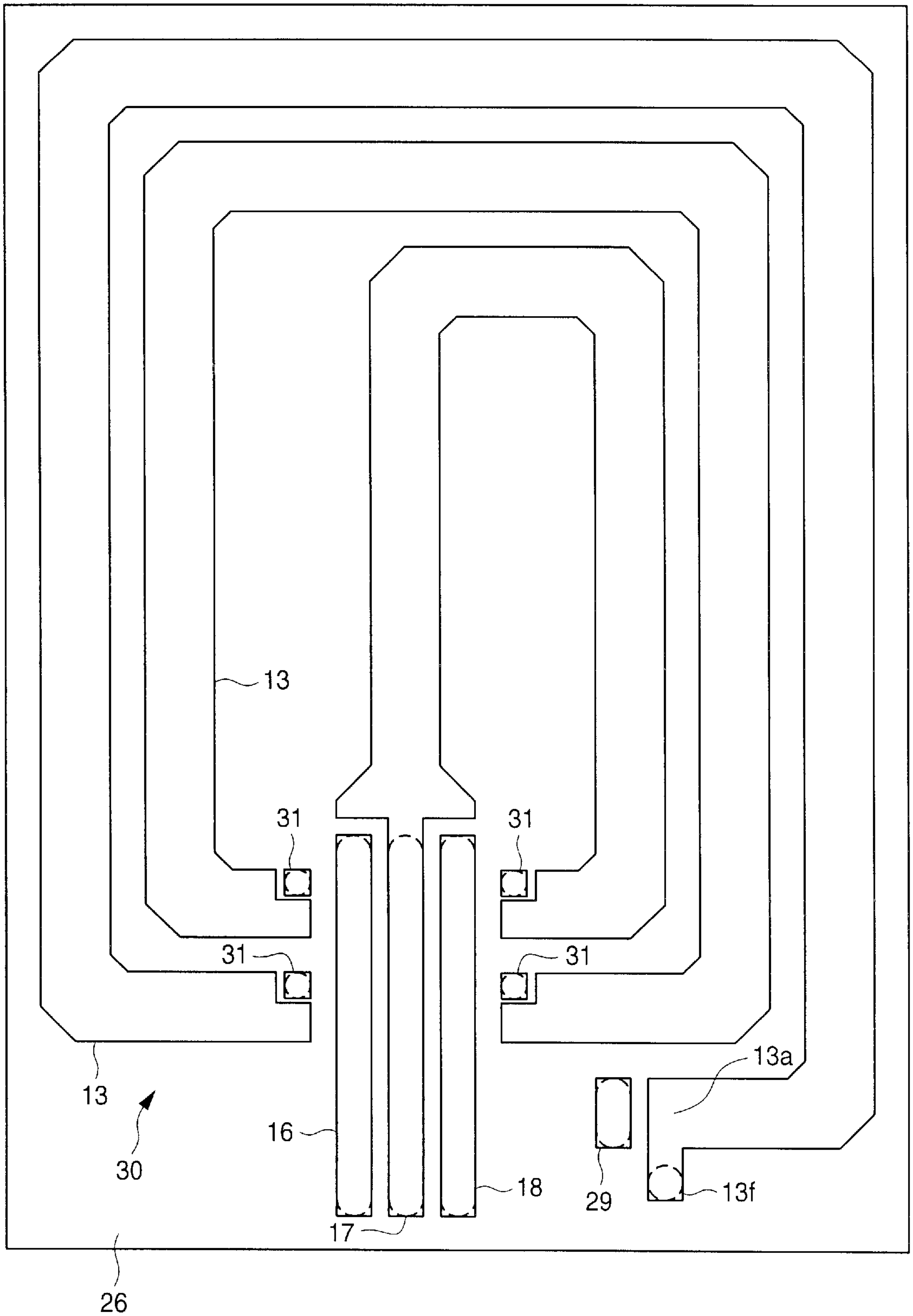

Referring to FIG. 3C, the middle metallization layer 30 is formed over dielectric layer 26. Metallization layer 30 may be, for example, a layer of copper or another conductive material. Metallization layer 30 is deposited on dielectric layer 26 and etched to create transmission line 13 and the top layer of connectors 16, 17, 18 using conventional deposition and photolithography techniques. As shown in the figure, the top layer of connector 17 is contiguous with transmission line 13 at inner terminus 13*b*.

Vias 27 in dielectric layer 26 beneath metallization layer 30 are shown in dashed lines in FIG. 3C. These vias provide points of contact between middle metallization layer 30 and bottom metallization layer 22. Thus, connectors 16, 17 and 18 reside in both the bottom and middle metallization layers 22 and 30.

An extension 13*f* contiguous with the outer terminus 13*a* of transmission line 13 is connected with contact strip 13*e* in bottom metallization layer 22 by means of another via 27. A metal portion 29 is formed over a via 27 in electrical contact with contact strip 12*e* in bottom metallization layer 22. Metal portion 29 provides electrical contact between contact strip 12*e* and transmission line 12 in the top metallization layer, as described below.

Similarly, metal portions 31 are formed separate from transmission line 13. These metal portions 31 provide electrical contact between transmission line 14 in bottom metallization layer 22 and bridge segments 12*c* in the top metallization layer, as described below.

Figure 3D:
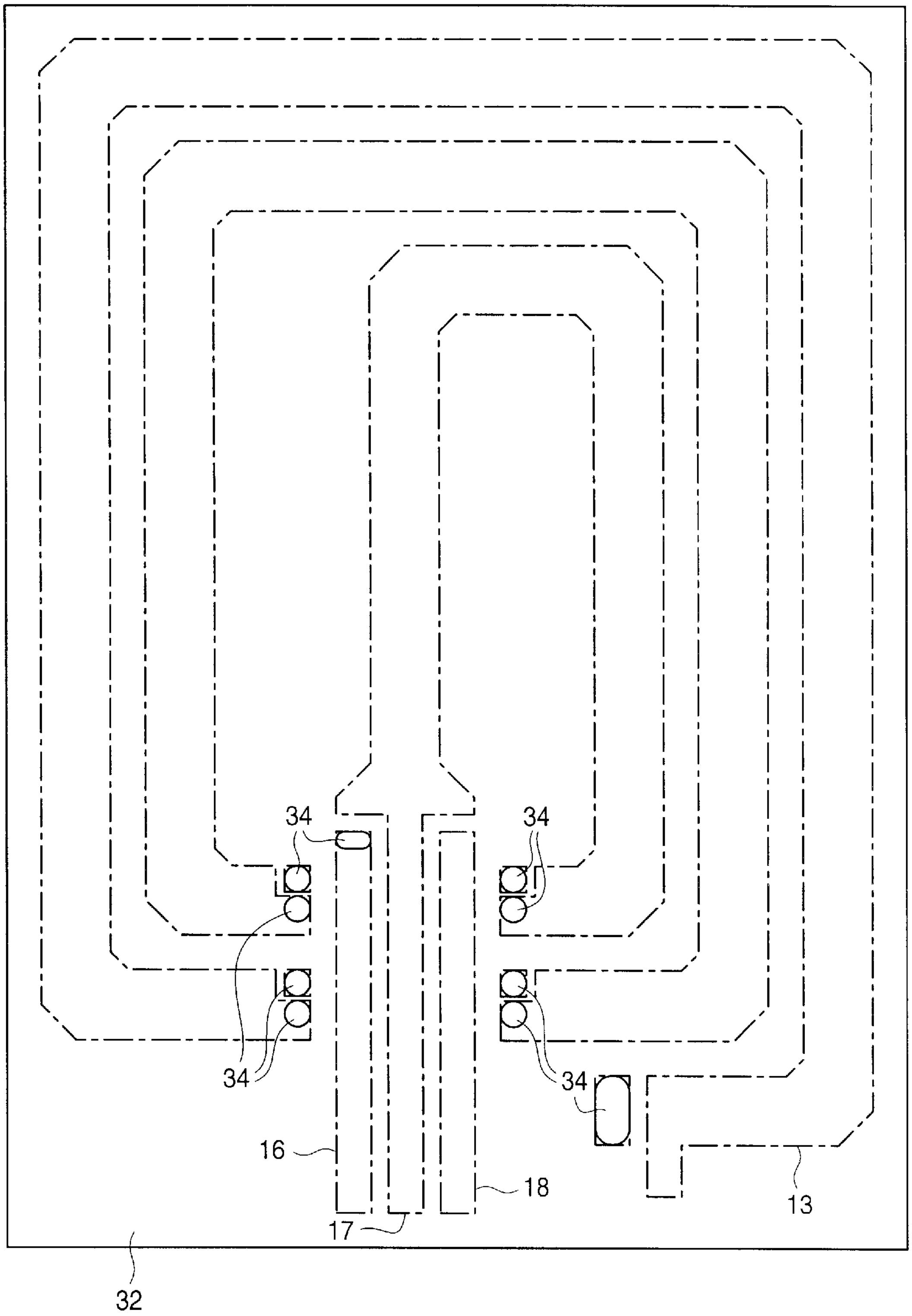

Referring to FIG. 3D, a dielectric layer 32 is deposited over metallization layer 30, which is shown in dashed lines in this figure. Dielectric layer 32 may be made using the same insulating material as dielectric layer 26 described above. Dielectric layer 32 is deposited using conventional techniques. Vias 34 are formed in dielectric layers 32 and 26 using conventional photolithography techniques. Vias 34 are formed in the locations shown to establish electrical contact between metallization layers, as described below.

Figure 3E:
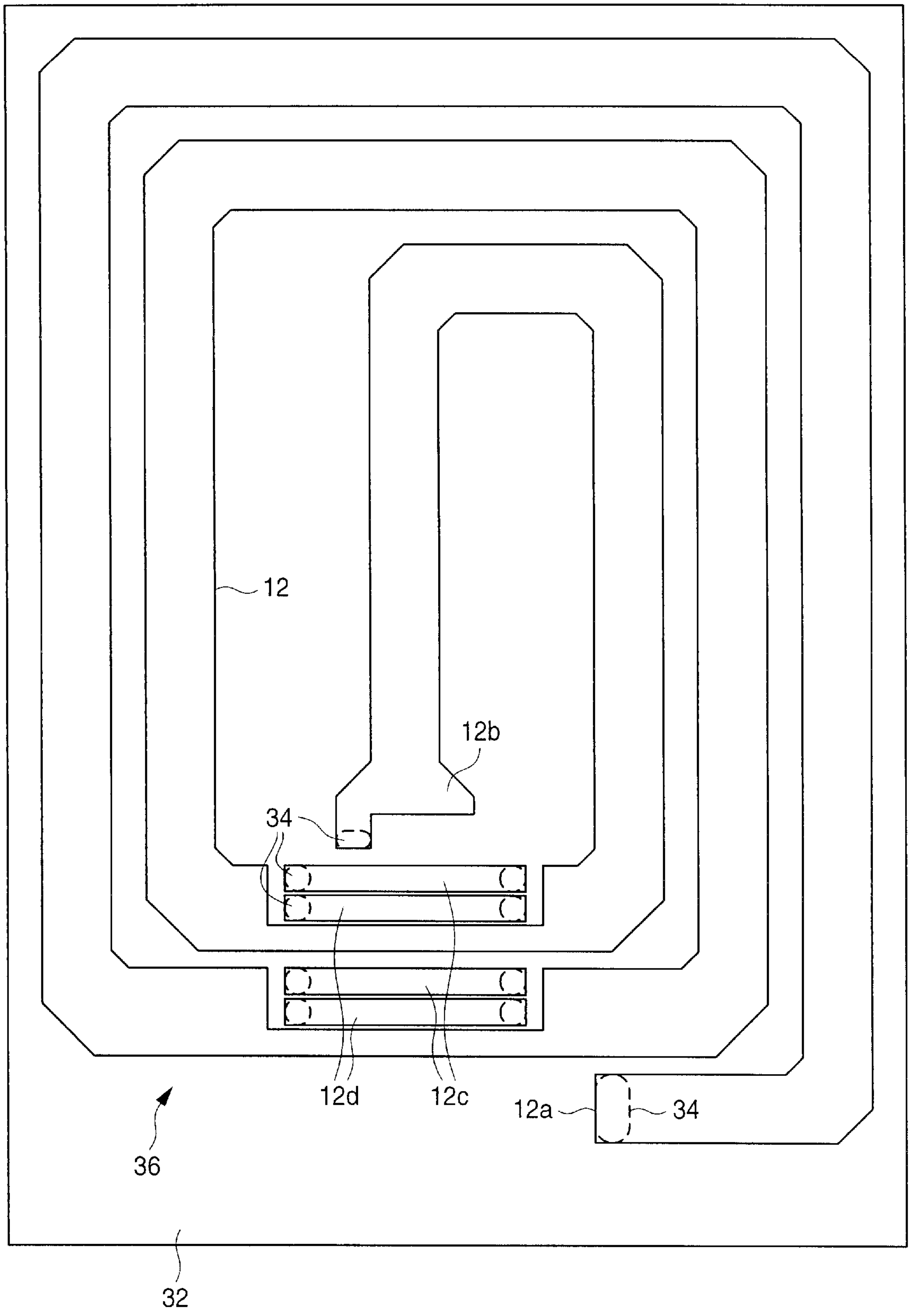

Referring to FIG. 3E, the top metallization layer 36 is formed over dielectric layer 32. Metallization layer 36 may be, for example, a layer of copper or another conductive material. Metallization layer 36 is deposited on dielectric layer 32 and etched to create transmission line 12 and bridge segments 12*c*, 12*d* using conventional deposition and photolithography techniques. During deposition, metallization layer 36 fills in the vias 34 in dielectric layer 32, establishing electrical contact to middle metallization layer 30.

Specifically, each bridge segment 12*c* is electrically connected on either end to a metal portion 31 in middle metallization layer 30, and is thereby electrically connected to transmission line 14 in bottom metallization layer 22. Bridge segments 12*c* therefore provide a conduction path for transmission line 14 across the gaps necessitated by connectors 16, 17 and 18.

Similarly, each bridge segment 12*d* is electrically connected on either end to transmission line 13 in middle metallization layer 30. Bridge segments 12*d* therefore provide a conduction path for transmission line 13 across the gaps necessitated by connectors 16, 17 and 18.

At its outer terminus 12*a*, transmission line 12 is electrically connected to metal portion 29 in middle metallization layer 30, and is thereby electrically connected to contact strip 12*e* in bottom metallization layer 22. Contact strip 12*e*, as previously described, provides a means to connect transmission line 12 to other wiring (not shown) patterned in bottom metallization layer 22. At its inner terminus 12*b*, transmission line 12 is electrically connected to connector 16 by means of a via 34.

Figure 4:
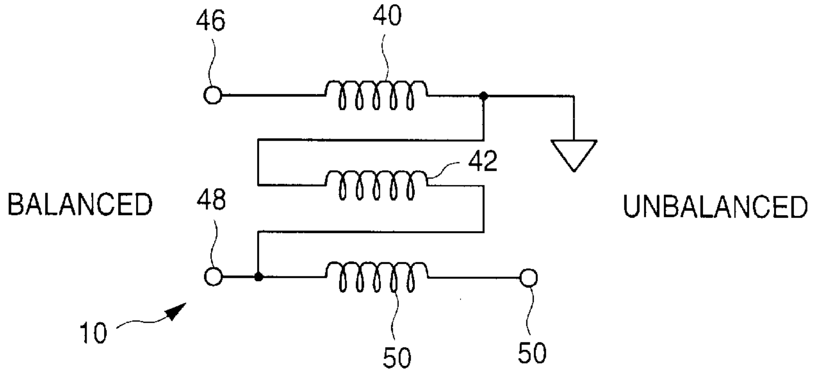
FIG. 4 is an equivalent schematic diagram of the balun.

Referring to FIG. 4, an equivalent schematic diagram of balun 10 is shown. In FIG. 4, transmission lines 12, 13, 14 are represented (in no particular order) by three parallel inductors 40, 42 and 44. The balanced side of balun 10 has two terminals 46 and 48, while the unbalanced side has one terminal 50 and a connection to a common potential (e.g. ground).

In the schematic diagram of FIG. 4, the transmission line coupling of the transmission lines 12, 13, 14 is reflected in the alignment of inductors 40, 42 and 44. Thus, the left side of each inductor may represent the inner terminus of the corresponding transmission line 12, 13, 14, while the right side of each inductor represents the outer terminus of the corresponding transmission line, or vice versa. All three inductors 40, 42, 44 must have the same orientation, so that, for example, the left side of the schematic represents the inner termini of all three transmission lines.

There are six possible ways to substitute transmission lines 12, 13 and 14 for the three inductors 40, 42 and 44 in FIG. 4. Furthermore, the "handedness" of the schematic may be changed by changing which side (left or right) represents the inner termini of the transmission lines 12, 13, 14. This gives a total of 12 possible interconnections of transmission lines 12, 13 and 14 to create balun 10.

These 12 possible interconnect cases for forming balun 10 are shown in Table A. Each row of the table represents a separate interconnect case, and provides the reference numeral of the terminal (or common potential) to which each transmission line terminus is connected.

Differences in actual circuit performance may be observed among the various interconnect cases listed in Table A. Experimentation may be conducted to determine the optimal interconnect scheme for a given circuit implementation.

2. The balun of claim 1, further comprising:

a first balanced-side terminal electrically connected to the first end of the first transmission line;

a second balanced-side terminal electrically connected to the first end of the third transmission line; and an unbalanced-side terminal electrically connected to the second end of the third transmission line.

3. The balun of claim 2, wherein the second end of the first transmission line is electrically connected to a common potential.

4. The balun of claim 1, wherein the second transmission line substantially overlies the first transmission line, and wherein the third transmission line substantially overlies the first and second transmission lines.

5. The balun of claim 4, further comprising:

a first insulating layer separating the first and second transmission lines; and a second insulating layer separating the second and third transmission lines.

6. The balun of claim 1, wherein the first end of each of the first, second and third transmission lines comprises an

TABLE A

| | Transmission line terminus | | | | | |
|---|---|---|---|---|---|---|
| Case | 12a | 13a | 14a | 12b | 13b | 14b |
| 1 | 48 | common | 46 | 50 | 48 | common |
| 2 | 46 | common | 48 | common | 48 | 50 |
| 3 | common | 48 | 46 | 48 | 50 | common |
| 4 | 46 | 48 | common | common | 50 | 48 |
| 5 | common | 46 | 48 | 48 | common | 50 |
| 6 | 48 | 46 | common | 50 | common | 48 |
| 7 | 50 | 48 | common | 48 | common | 46 |
| 8 | common | 48 | 50 | 46 | common | 48 |
| 9 | 48 | 50 | common | common | 48 | 46 |
| 10 | common | 50 | 48 | 46 | 48 | common |
| 11 | 48 | common | 50 | common | 46 | 48 |
| 12 | 50 | common | 48 | 48 | 46 | common |

It will be appreciated that balun 10 provides a transition of balanced to unbalanced conductors in a manner readily apparent to those skilled in the art. Balun 10 may be used, for example, as a high performance balun for an RF push-pull amplifier with integrated matching network.

Although the present invention and its advantages have been described in detail, it should be understood that various changes, substitutions, and alterations can be made therein without departing from the spirit and scope of the invention as defined by the appended claims.

We claim:

1. A balun comprising:

a substrate;

a first spiral-shaped transmission line overlying the substrate, the first transmission line having first and second ends;

a second spiral-shaped transmission line substantially vertically aligned with the first transmission line, the second transmission line having a first end electrically connected to the second end of the first transmission line; and a third spiral-shaped transmission line substantially vertically aligned with the first and second transmission lines, the third transmission line having a first end electrically connected to a second end of the second transmission line.

inner terminus of the respective transmission line, and wherein the second end of each of the first, second and third transmission lines comprises an outer terminus of the respective transmission line.

7. A broadside-coupled transmission line element comprising:

a first metallization layer having a first spiral-shaped transmission line and a plurality of connector segments formed therein, the first transmission line having first and second ends, the connector segments providing respective conduction paths between an inner area of the first transmission line and an outer area of the first transmission line, a first one of the connector segments being electrically connected to one of the ends of the first transmission line, the first transmission line having a gap at each intersection with the connector segments;

a second metallization layer having a second spiral-shaped transmission line formed therein, the second transmission line having first and second ends; and a third metallization layer having a third spiral-shaped transmission line and a bridge segment formed therein, the bridge segment spanning one of the gaps in the first transmission line, the third transmission line having first and second ends.

8. The broadside-coupled transmission line element of claim 7, wherein the first end of the second transmission line is electrically connected to the second end of the first transmission line, and wherein the first end of the third transmission line is electrically connected to the second end of the second transmission line, whereby the broadside-coupled transmission line element forms a balun.

9. The broadside-coupled transmission line element of claim 8, further comprising:

a first balanced-side terminal electrically connected to the first end of the first transmission line;

a second balanced-side terminal electrically connected to the first end of the third transmission line; and an unbalanced-side terminal electrically connected to the second end of the third transmission line.

10. The broadside-coupled transmission line element of claim 9, wherein the second end of the first transmission line is electrically connected to a common potential.

11. The broadside-coupled transmission line element of claim 7, wherein the second transmission line substantially overlies the first transmission line, and wherein the third transmission line substantially overlies the first and second transmission lines.

12. The broadside-coupled transmission line element of claim 11, further comprising:

a first insulating layer separating the first and second transmission lines; and a second insulating layer separating the second and third transmission lines.

13. The broadside-coupled transmission line element of claim 7, wherein the first end of each of the first, second and third transmission lines comprises an inner terminus of the respective transmission line, and wherein the second end of each of the first, second and third transmission lines comprises an outer terminus of the respective transmission line.

14. A method for creating a balun on a semiconductor substrate, comprising:

forming a first transmission line on the substrate, the first mission line having first and second ends;

forming a second transmission line substantially overlying the first transmission line, the second transmission line having a first end electrically connected to the second end of the first transmission line; and forming a third transmission line substantially overlying the first and second transmission lines, the third transmission line having a first end electrically connected to a second end of the second transmission line.

15. The method of claim 14, further comprising forming a dielectric layer over the first transmission line before forming the second transmission line.

16. The method of claim 14, further comprising forming a dielectric layer over the second transmission line before forming the third transmission line.

* * * * *